(12) United States Patent
Usami et al.

(10) Patent No.: US 10,892,300 B2
(45) Date of Patent: Jan. 12, 2021

(54) STORAGE DEVICE

(71) Applicant: Toshiba Memory Corporation, Minato-ku (JP)

(72) Inventors: Takanori Usami, Yokkaichi (JP); Takeshi Ishizaki, Nagoya (JP); Ryohei Kitao, Yokkaichi (JP); Katsuyoshi Komatsu, Yokkaichi (JP); Takeshi Iwasaki, Kuwana (JP); Atsuko Sakata, Yokkaichi (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 16/570,230

(22) Filed: Sep. 13, 2019

(65) Prior Publication Data
US 2020/0286954 A1 Sep. 10, 2020

(30) Foreign Application Priority Data

Mar. 8, 2019 (JP) ................. 2019-042353

(51) Int. Cl.
*H01L 27/24* (2006.01)
*H01L 27/22* (2006.01)

(52) U.S. Cl.
CPC ........ *H01L 27/2409* (2013.01); *H01L 27/224* (2013.01)

(58) Field of Classification Search
CPC ................. H01L 27/2409; H01L 27/224
USPC ........................................................... 257/7, 5
See application file for complete search history.

(56) References Cited

U.S. PATENT DOCUMENTS

| 2010/0052177 A1* | 3/2010 | Meijer ................ B82Y 10/00 257/773 |
| 2016/0336378 A1 | 11/2016 | Ohba et al. |
| 2017/0117328 A1 | 4/2017 | Terai |
| 2018/0277601 A1 | 9/2018 | Ahn et al. |

FOREIGN PATENT DOCUMENTS

| JP | 05-060434 B2 | | 9/1993 |
| JP | 2017-085103 A | | 5/2017 |
| JP | 2018-164085 A | | 10/2018 |
| KR | 1020070088962 | * | 8/2007 |
| TW | 200636726 A | | 10/2006 |
| TW | 201903762 A | | 1/2019 |
| TW | 201904101 A | | 1/2019 |

* cited by examiner

*Primary Examiner* — Caleen O Sullivan
(74) *Attorney, Agent, or Firm* — Oblon, McClelland, Maier & Neustadt, L.L.P.

(57) ABSTRACT

A storage device according to embodiments includes a first conductive layer; a second conductive layer; a resistance change element provided between the first conductive layer and the second conductive layer; and an intermediate layer provided in any one of a position between the resistance change element and the first conductive layer and a position between the resistance change element and the second conductive layer, the intermediate layer containing at least one element of silicon (Si) and germanium (Ge), tellurium (Te), and aluminum (Al).

15 Claims, 6 Drawing Sheets

STORAGE DEVICE

CROSS-REFERENCE TO RELATED APPLICATION

This application is based upon and claims the benefit of priority from Japanese Patent Application No. 2019-042353, filed on Mar. 8, 2019, the entire contents of which are incorporated herein by reference.

FIELD

Embodiments described herein relate generally to a storage device.

BACKGROUND

As a large-capacity non-volatile storage device, there is a cross-point type two-terminal storage device. The cross-point type two-terminal storage device facilitates scaling-down and high integration of memory cells.

As the two-terminal storage device, there may be exemplified a magnetoresistive memory (magnetoresistive random access memory: MRAM), a resistance change memory (resistive random access memory: ReRAM), a phase change memory (PCM), a ferroelectric memory (ferroelectric random access memory: FeRAM), and the like. The two-terminal storage device has a resistance change element in which the resistance of a memory cell is changed by application of voltage or current. For example, a high-resistance state of the resistance change element is defined as data "0", and a low-resistance state is defined as data "1". The memory cell can maintain different resistance states, and thus, it is possible to store 1-bit data of "0" and "1".

In a cross-point type memory array, for example, a large number of metal wires called bit lines and word lines are arranged to intersect each other, and memory cells are formed at cross points of the bit lines and the word lines. Writing of one memory cell is performed by applying a voltage to the bit line and the word line connected to the memory cell.

A large number of memory cells are connected to one bit line and one word line. For this reason, for example, at the time of writing, a voltage (half-selection voltage: a voltage lower than that of the selected cell) is also applied to the large number of cells (half-selected cells) connected to the same bit line and the same word line as the cell to be written (selected cell), and thus, a current (half-selection leak current) flows. A large half-selection leak current causes, for example, an increase in power consumption of a chip. In addition, voltage drop at the wire is increasing, and thus, a sufficiently high voltage is not applied to the selected cell. Therefore, in the cross-point type memory array, it is necessary to realize memory cells of which the half-selection leak current is small.

To realize a small memory cell with less half-selection leak current, for example, a switching element in series connected to the resistance change element is provided. The switching element has non-linear current-voltage characteristics in which a current rises steeply with a specific voltage (hereinafter, referred to as a threshold voltage). The half-selection leak current flowing in the half-selected cell can be suppressed by the switching element.

For a low voltage operation of the storage device, the memory cell operation is required to be performed at a low voltage. In order to realize the memory cell operation at a low voltage, the operation of the switching element is also required to be performed at a low voltage, and thus, the threshold voltage of the switching element is desired to be reduced. However, if the threshold voltage of the switching element is lowered, there is a concern that the leak current of the switching element is increased, and as a result, the half-selection leak current is increased.

DETAILED DESCRIPTION

Figure 1:
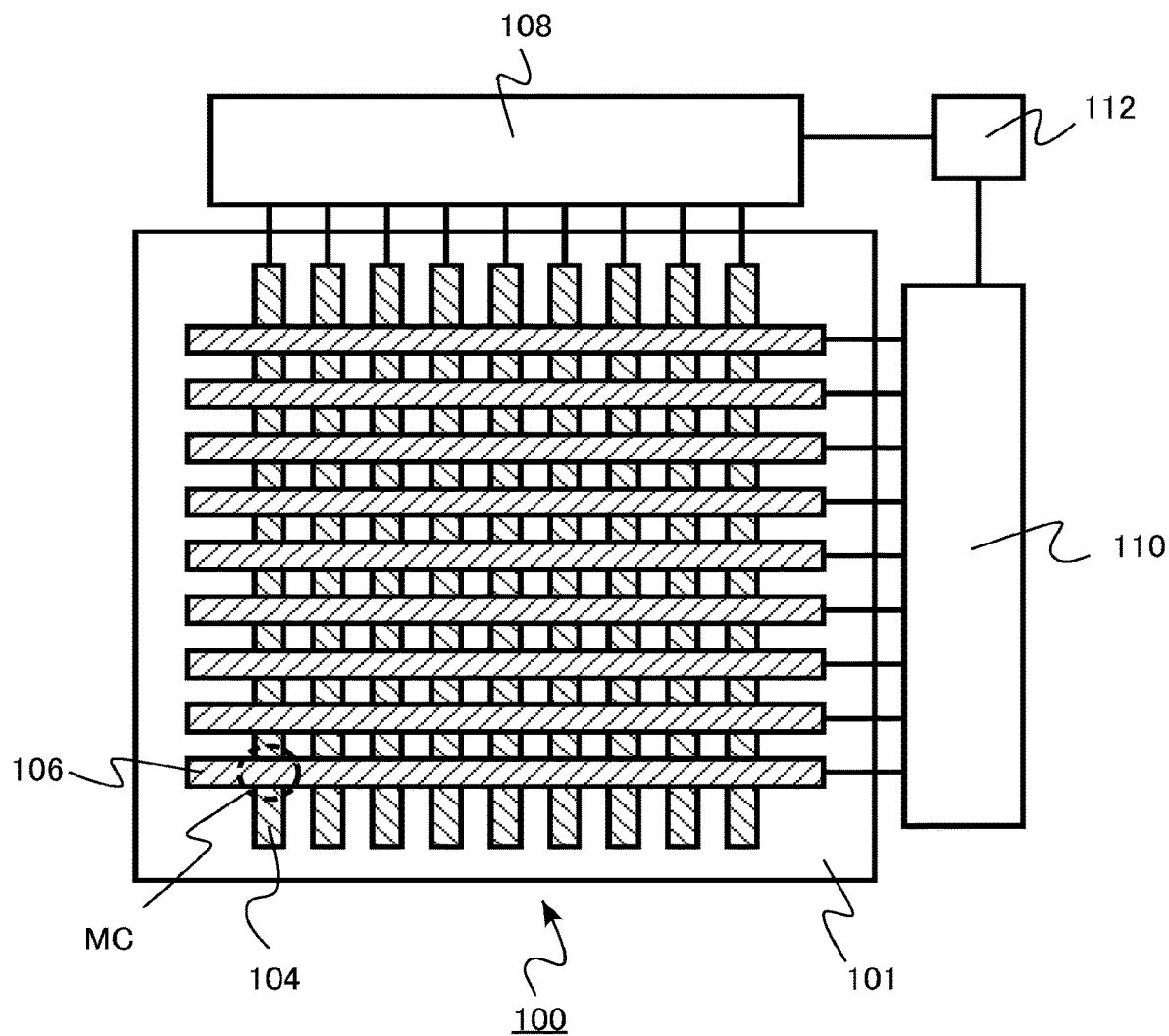
FIG. 1 is a block diagram of a storage device according to a first embodiment.

A storage device according to an embodiment includes: a first conductive layer; a second conductive layer; a resistance change element provided between the first conductive layer and the second conductive layer; and an intermediate layer provided in any one of a position between the resistance change element and the first conductive layer and a position between the resistance change element and the second conductive layer, the intermediate layer containing at least one element of silicon (Si) and germanium (Ge), tellurium (Te), and aluminum (Al).

Hereinafter, embodiments will be described with reference to the drawings. In the following description, the same or similar members will be denoted by the same reference numerals, and redundant descriptions of the members that are described once will be appropriately omitted. Hereinafter, storage devices according to embodiments will be described with reference to the drawings.

Hereinafter, storage devices according to embodiments will be described with reference to the drawings.

First Embodiment

A storage device according to a first embodiment includes a first conductive layer; a second conductive layer; a resistance change element provided between the first conductive layer and the second conductive layer; and an intermediate layer provided in any one of a position between the resistance change element and the first conductive layer and a position between the resistance change element and the second conductive layer, the intermediate layer containing at least one element of silicon (Si) and germanium (Ge), tellurium (Te), and aluminum (Al).

In addition, a storage device according to a first embodiment includes, a plurality of first wires; a plurality of second wires intersecting the plurality of first wires; and memory cells located in regions where the first wires and the second wires intersect each other. Each of the memory cells includes a resistance change element provided between one of the first wires and one of the second wires and an intermediate layer provided in any one of a position between the resistance change element and the one of the first wires and a position between the resistance change element and the one of the second wire, the intermediate layer containing at least one element of silicon (Si) and germanium (Ge), tellurium (Te), and aluminum (Al).

Figure 2:
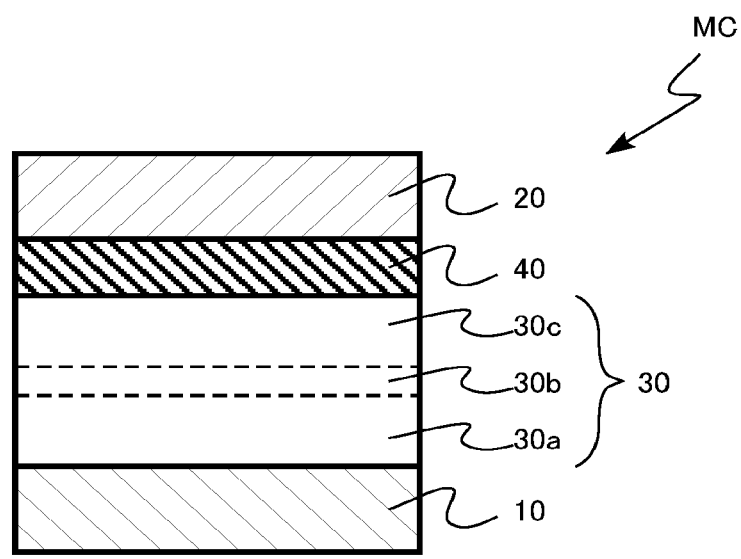
FIG. 2 is a schematic cross-sectional view of a memory cell of the storage device according to the first embodiment.

FIG. 1 is a block diagram of the storage device according to the first embodiment. FIG. 2 is a schematic cross-sectional view of a memory cell of the storage device according to the first embodiment. FIG. 2 illustrates a cross section of one of the memory cells MC illustrated by, for example, dotted circles in the memory cell array 100 of FIG. 1.

The memory cell array 100 of the storage device according to the first embodiment includes a plurality of word lines (first wires) 104 and a plurality of bit lines (second wires) 106 intersecting the word lines 104, for example, through an insulating layer on the semiconductor substrate 101. The bit lines 106 are provided on an upper layer of the word line 104. In addition, as peripheral circuits, a first control circuit 108, a second control circuit 110, and a sense circuit 112 are provided around the memory cell array 100, A plurality of memory cells MC are provided in regions where the word lines 104 and bit lines 106 intersect each other. The storage device according to the first embodiment is a two-terminal magnetoresistive memory having a cross-point structure.

Each of the plurality of word lines 104 is connected to the first control circuit 108. In addition, each of the plurality of the bit lines 106 is connected to the second control circuit 110. The sense circuit 112 is connected to the first control circuit 108 and the second control circuit 110.

The first control circuit 108 and the second control circuit 110 have functions of, for example, selecting the desired memory cell MC, writing data in the memory cell MC, reading data of the memory cell MC, erasing data of the memory cell MC, and the like. At the time of reading the data, the data of the memory cell MC is read out as an amount of current flowing between the word line 104 and the bit line 106. The sense circuit 112 has a function of determining the amount of the current to identify the polarity of data. For example, "0" and "1" of the data are determined.

The first control circuit 108, the second control circuit 110, and the sense circuit 112 are configured with, for example, electronic circuits using semiconductor devices formed on the semiconductor substrate 101.

As illustrated in FIG. 2, the memory cell MC includes a lower electrode 10 (first conductive layer), an upper electrode 20 (second conductive layer), a resistance change element 30, and a switching element 40 (intermediate layer).

The lower electrode 10 is connected to the word line 104. The lower electrode 10 is, for example, a metal. The lower electrode 10 is, for example, titanium (Ti), tungsten (W), tantalum (Ta), platinum (Pt), or nitrides of these metals. The lower electrode 10 is, for example, a titanium nitride. The lower electrode 10 may be a portion of the word line 104.

The upper electrode 20 is connected to the bit line 106. The upper electrode 20 is, for example, a metal. The upper electrode 20 is, for example, titanium (Ti), tungsten (W), tantalum (Ta), platinum (Pt), or nitrides of these metals. The upper electrode 20 is, for example, a titanium nitride. The upper electrode 20 may be a portion of the bit line 106.

The resistance change element 30 is provided between the lower electrode 10 and the upper electrode 20. The resistance change element 30 includes a fixed layer 30a, a tunnel layer 30b, and a free layer 30c. The resistance change element 30 has a magnetic tunnel junction configured with the fixed layer 30a, the tunnel layer 30b, and the free layer 30c.

The resistance change element 30 has a function of storing data by resistance change.

The fixed layer 30a is a ferromagnetic substance. In the fixed layer 30a, the magnetization direction is fixed to a specific direction.

The tunnel layer 30b is an insulation substance. Due to the tunnel effect, electrons pass through the tunnel layer 30b.

The free layer 30c is a ferromagnetic substance. In the free layer 30c, the magnetization direction is changed. As the magnetization direction of the free layer 30c, anyone state of the direction parallel to the magnetization direction of the fixed layer 30a and the direction opposite to the magnetization direction of the fixed layer 30a can be taken. By allowing the current to flow, for example, between the lower electrode 10 and the upper electrode 20, the magnetization direction of the free layer 30c can be changed.

By changing the magnetization direction of the free layer 30c, the resistance of the resistance change element 30 is changed. If the magnetization direction of the free layer 30c becomes opposite to the magnetization direction of the fixed layer 30a, the resistance change element 30 is in a high-resistance state where a current is hard to flow. On the other hand, if the magnetization direction of the free layer 30c becomes parallel to the magnetization direction of the fixed layer 30a, the resistance change element 30 is in a low-resistance state where a current is easy to flow.

The switching element 40 is provided in one of a position between the resistance change element 30 and the lower electrode 10 and a position between the resistance change element 30 and the upper electrode 20. FIG. 2 illustrates a case where the switching element 40 is provided between the resistance change element 30 and the upper electrode 20. The switching element 40 is, for example, in contact with the resistance change element 30.

The switching element 40 has non-linear current-voltage characteristics in which a current rises steeply with a certain voltage (threshold voltage). The switching element 40 has a function of suppressing an increase in half-selection leak current flowing in the half-selected cell.

The switching element 40 contains at least one element of silicon (Si) and germanium (Ge), tellurium (Te), and aluminum (Al). The switching element 40 is made of, for example, a compound including at least one element of silicon (Si) and germanium (Ge), tellurium (Te), and aluminum (Al). For example, a sum of atomic concentrations of Si and Ge, tellurium (Te), and aluminum (Al) is 50 atomic % or more and 100 atomic % or less in the switching element 40.

The switching element 40 contains, for example, nitrogen (N). The atomic concentration of nitrogen (N) in the switching element 40 is, for example, 30 atomic % or more and 60 atomic % or less.

The switching element 40 contains, for example, oxygen (O). The atomic concentration of oxygen (O) in the switching element 40 is, for example, 5 atomic % or more and 60 atomic % or less.

The atomic concentration of Si or Ge in the switching element 40 is, for example, higher than the atomic concentration of aluminum (Al). For example, the atomic concentration of silicon (Si) in the switching element 40 is higher than the atomic concentration of aluminum (Al). For example, the atomic concentration of germanium (Ge) in the switching element 40 is higher than the atomic concentration of aluminum (Al).

The atomic concentration of silicon (Si) in the switching element 40 is, for example, 20 atomic % or more. Further, the atomic concentration of germanium (Ge) in the switching element 40 is, for example, 20 atomic % or more.

The thickness of the switching element 40 is, for example, 5 nm or more and 20 nm or less.

The kind of atoms contained in the switching element 40 can be measured by, for example, Energy Dispersive X-ray Spectroscopy (EDX) or Secondary Ion Mass Spectrometry (SIMS). The atomic concentration of the atoms contained in the switching element 40 can be calculated from the number atoms per unit volume measured by, for example, SIMS as follows; (atomic concentration of element X)=(number of element X atoms)/(number of silicon (Si) atoms+number of germanium (Ge) atoms+number of tellurium (Te) atoms+ number of aluminum (Al) atoms+number of nitrogen (N) atoms+number of oxygen (O) atoms). For example, an atomic concentration (atomic %) of silicon (Si) is as follows; (atomic concentration of silicon (Si))=(number of silicon (Si) atoms)/(number of silicon (Si) atoms+number of germanium (Ge) atoms+number of tellurium (Te) atoms+number of aluminum (Al) atoms+number of nitrogen (N) atoms+ number of oxygen (O) atoms. For example, an atomic concentration (atomic %) of nitrogen (N) is as follows; (atomic concentration of nitrogen (N))=(number of nitrogen (N) atoms)/(number of silicon (Si) atoms+number of germanium (Ge) atoms+number of tellurium (Te) atoms+number of aluminum (Al) atoms+number of nitrogen (N) atoms+ number of oxygen (O) atoms). The thickness of the switching element 40 can be measured by, for example, a Transmission Electron Microscope (TEM).

Next, functions and effects of the storage device according to the first embodiment are described.

In the storage device according to the first embodiment, as described above, by changing the magnetization direction of the free layer 30c, the resistance of the resistance change element 30 is changed. If the magnetization direction of the free layer 30c becomes opposite to the magnetization direction of the fixed layer 30a, the resistance change element 30 is in a high-resistance state where a current is hard to flow. On the other hand, if the magnetization direction of the free layer 30c becomes parallel to the magnetization direction of the fixed layer 30a, the resistance change element 30 is in a low-resistance state where a current is easy to flow.

For example, the high-resistance state of the resistance change element 30 is defined as data "1", and the low-resistance state is defined as data "0". The memory cells MC can maintain different resistance states, so that it is possible to store 1-bit data of "0" and "1". Writing of one memory cell is performed by allowing a current to flow between the bit line and the word line connected to the cell.

Figure 3:
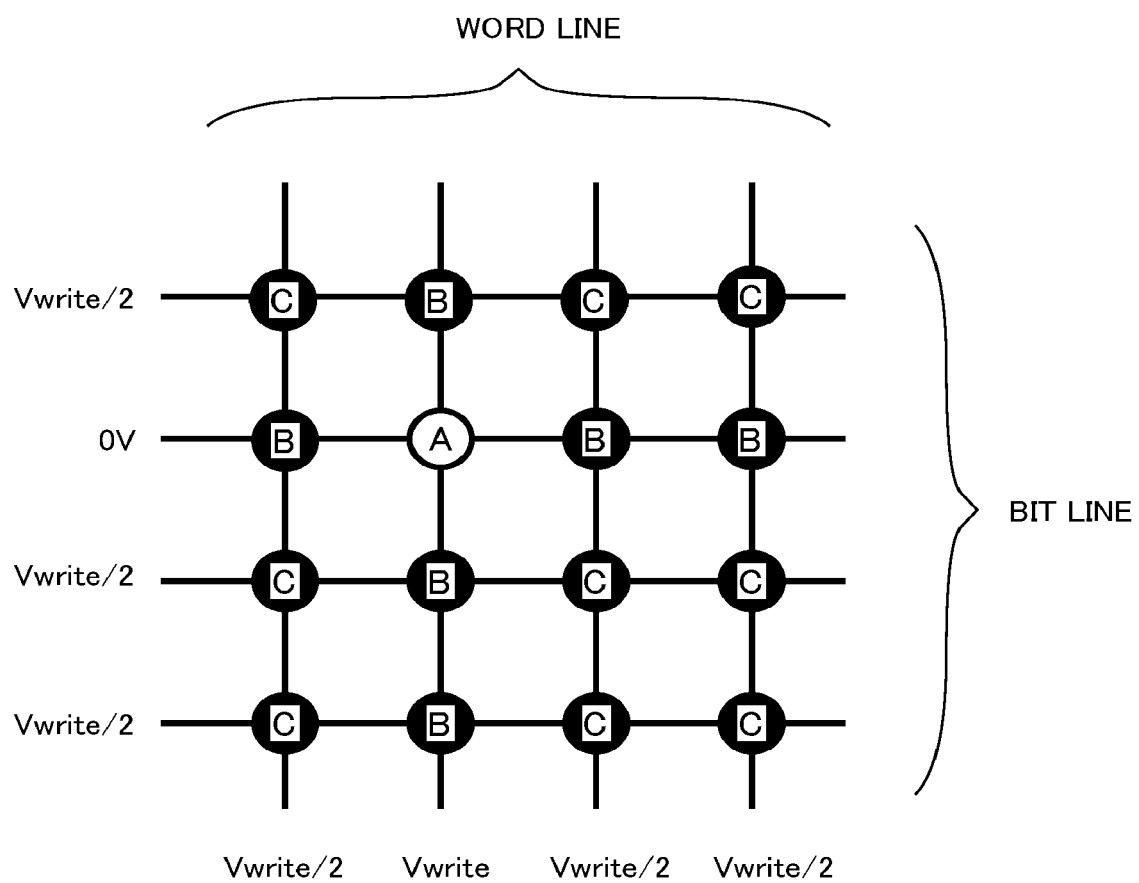
FIG. 3 is a diagram illustrating a problem of the storage device according to the first embodiment.

FIG. 3 is a diagram illustrating a problem of the storage device according to the first embodiment. FIG. 3 illustrates the voltage applied to the memory cell MC when one memory cell MC in the memory cell array is selected for the write operation. Each of cross points of the word lines and the bit lines represents each memory cell MC.

The selected memory cell MC is a memory cell A (selected cell). The word line connected to the memory cell A is applied with a write voltage Vwrite. Further, the bit line connected to the memory cell A is applied with 0 V.

Hereinafter, an example where the word lines and the bit line not connected to the memory cell A are applied with the half voltage (Vwrite/2) of the write voltage is described.

The voltage applied to the memory cells C (non-selected cell) connected to the word line and the bit line not connected to the memory cell A is 0 V. In other words, voltage is not applied.

On the other hand, the memory cell B (half-selected cell) connected to the word line or the bit line connected to the memory cell A is applied with the half voltage (Vwrite/2) of the write voltage Vwrite. Therefore, the half-selection leak current flows in the memory cell B (half-selected cell).

A large half-selection leak current leads to, for example, the increasing power consumption of the chip. Furthermore, for example, due to the increasing voltage drop at the wire, a sufficiently high voltage is not applied to the selected cell, so that the write operation becomes unstable.

Figure 4:
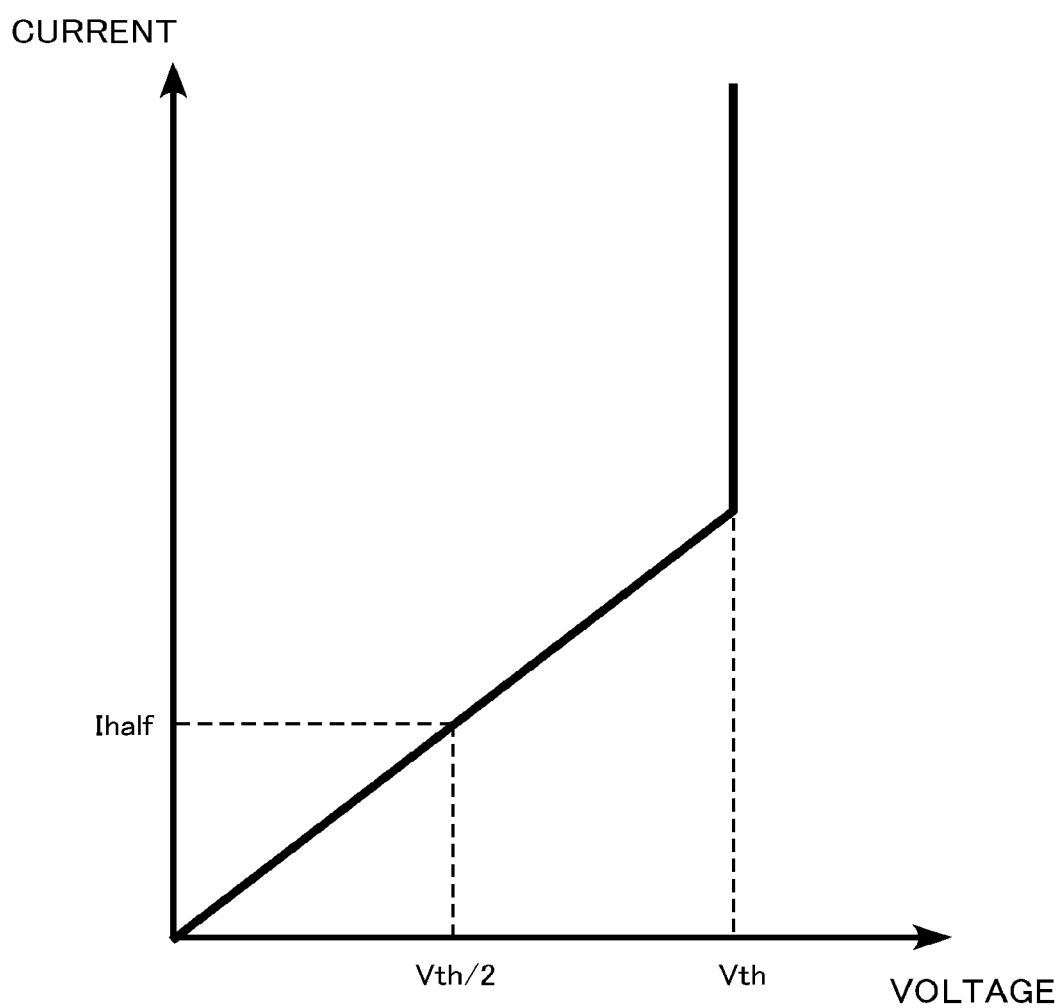
FIG. 4 is a graph showing a current-voltage characteristic of a switching element of the first embodiment.

FIG. 4 is a graph showing a current-voltage characteristic of the switching element of the first embodiment. The horizontal axis represents the voltage applied to the switching element 40, and the vertical axis represents the current flowing in the switching element 40.

The switching element 40 has non-linear current-voltage characteristics in which a current rises steeply with the threshold voltage Vth. The threshold voltage Vth is lower than the write voltage Vwrite and higher than the half voltage (Vwrite/2) of the write voltage Vwrite. Since the current flowing in the switching element 40 in series connected to the resistance change element 30 in a range of the threshold voltage Vth or less is small, it is possible to suppress the half-selection leak current flowing in the half-selected cell.

For the low voltage operation of the storage device, the memory cell operation is required to be performed at a low voltage. In order to realize the memory cell operation at a low voltage, the operation of the switching element 40 is also required to be performed at a low voltage, and thus, the threshold voltage Vth of the switching element 40 is desired to be reduced. However, if the threshold voltage Vth of the switching element 40 is lowered, there is a concern that the leak current of the switching element 40 is increased, and as a result, the half-selection leak current is increased.

Herein, it is assumed that the voltage applied to the switching element 40 of the half-selected cell is Vth/2. Then, the current value flowing in the switching element 40 when the voltage is Vth/2 is defined as a half-selection current (Ihalf). Hereinafter, the half-selection current (Ihalf) is used as an index of the current value flowing in the switching element 40 of the half-selected cell.

In the storage device according to the first embodiment, the switching element 40 contains at least one elements of silicon (Si) and germanium (Ge), tellurium (Te), and aluminum (Al). According to the configuration, while suppressing the increase in half-selection current, it is possible to lower the threshold voltage Vth of the switching element 40.

Figure 5A:
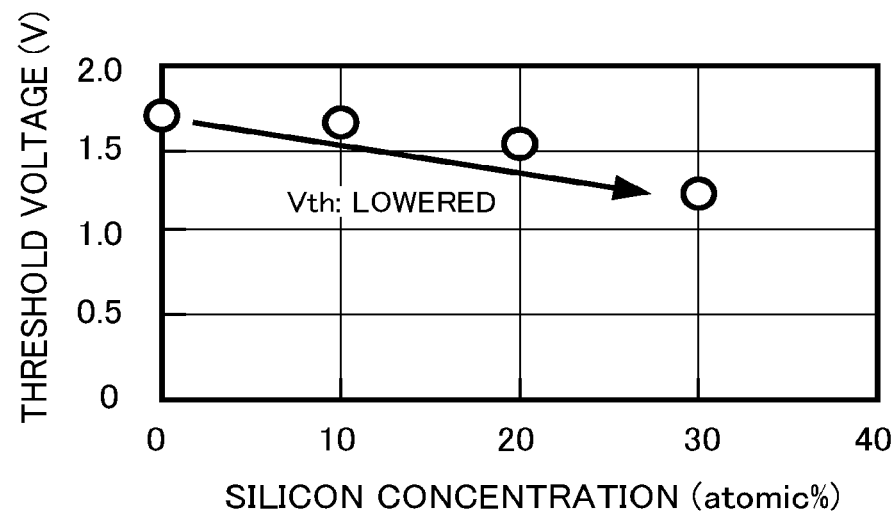
FIGS. 5A and 5B are graphs showing electrical characteristics of the switching elements of the first embodiment.
Figure 5B:
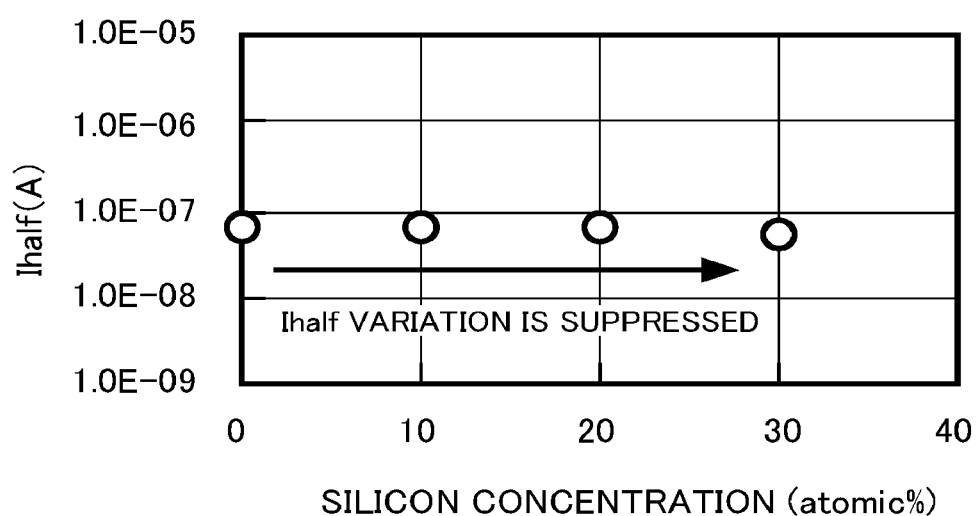

FIGS. 5A and 5B are graphs showing electrical characteristics of the switching element of the first embodiment. FIG. 5A is a graph showing a relationship between the silicon concentration and the threshold voltage Vth of the switching element 40. FIG. 5B is a graph showing a relationship between the silicon concentration and the half-selection current (Ihalf) of the switching element 40.

The measured switching element 40 contains aluminum (Al), silicon (Si), tellurium (Te), and nitrogen (N). A sum of the atomic concentrations of aluminum (Al) and silicon (Si) is fixed at 40 atomic %. The atomic concentration of tellurium (Te) is 20 atomic %, and the atomic concentration of nitrogen (N) is 40 atomic %. By changing the concentration of silicon in the switching element 40, the atomic concentration ratio of aluminum and silicon is changed.

The measured switching element 40 is formed in a nitrogen atmosphere by performing co-sputtering using aluminum (Al), silicon (Si), and tellurium (Te) as targets. The thickness of the switching element 40 is 12 nm. The upper and lower electrodes are formed by using a titanium nitride.

As apparent from FIG. 5A, by increasing the concentration of silicon in the switching elements 40, the threshold voltage Vth is lowered. By increasing the concentration of silicon from 0 atom % to 30 atom %, the threshold voltage Vth is lowered by about 0.5 V.

As apparent from FIG. 5B, even though the concentration of silicon in the switching elements 40 is set to be high, the half-selection leak current (Ihalf) is maintained substantially constant. In other words, even though the concentration of silicon in the switching elements 40 is set to be high, the half-selection leak current (Ihalf) is not increased. A variation of the half-selection leak current (Ihalf) is suppressed.

Therefore, according to the first embodiment, it is possible to lower the threshold voltage Vth while suppressing the increasing of the half-selection current of the switching element 40.

It is considered that, even in a case where the element contained in the switching element 40 is changed from silicon (Si) to germanium (Ge) which is an element in the same Group 14 and has similar properties, the same effect can be obtained.

A sum of atomic concentrations of at least one element of silicon (Si) and germanium (Ge), tellurium (Te), and aluminum (Al) contained in the switching element 40 is preferably 50 atomic % or more and more preferably 60 atomic % or more. By satisfying the above conditions, it is possible to obtain good non-linearity in current-voltage characteristics.

The switching element 40 preferably contains nitrogen (N). Since the switching element 40 contains nitrogen (N), it is possible to decrease the half-selection current. From the viewpoint of decreasing the half-selection current, the atomic concentration of nitrogen (N) in the switching element 40 is preferably 30 atomic % or more and more preferably 40 atomic % or more.

The switching element 40 preferably contains oxygen (O). Since the switching element 40 contains oxygen (O), it is possible to decrease the half-selection current. From the viewpoint of decreasing the half-selection current, the atomic concentration of oxygen (O) in the switching element 40 is preferably 5 atomic % or more and more preferably 10 atomic % or more.

From the viewpoint of lowering the threshold voltage Vth, the atomic concentration of at least one element of silicon (Si) and germanium (Ge) is preferably higher than the atomic concentration of aluminum (Al). From the viewpoint of lowering the threshold voltage Vth, the atomic concentration of at least one element of silicon (Si) and germanium (Ge) in the switching elements 40 is preferably 20 atomic % or more and more preferably 30 atomic % or more.

From the viewpoint of lowering the threshold voltage Vth, the atomic concentration of silicon (Si) in the switching element 40 is preferably higher than the atomic concentration of aluminum (Al). From the viewpoint of lowering the threshold voltage Vth, the atomic concentration of silicon (Si) in the switching element 40 is preferably 20 atomic % or more and more preferably 30 atomic % or more.

From the viewpoint of lowering the threshold voltage Vth, the atomic concentration of germanium (Ge) in the switching element 40 is preferably higher than the atomic concentration of aluminum (Al). From the viewpoint of lowering the threshold voltage Vth, the atomic concentration of germanium (Ge) in the switching element 40 is preferably 20 atomic % or more and more preferably 30 atomic % or more.

As described above, according to the storage device according to the first embodiment, it is possible to lower the threshold voltage while suppressing the increasing of the half-selection current of the switching element 40. Therefore, it is possible to suppress the half-selection leak current of the memory cell. Thus, for example, a storage device capable of perform a low-voltage operation is realized.

Second Embodiment

A storage device according to a second embodiment is different from the storage device according to the first embodiment in that the storage device according to the second embodiment is a resistance change memory (ReRAM). Hereinafter, the same contents as those of the first embodiment are partly omitted in description.

Figure 6:
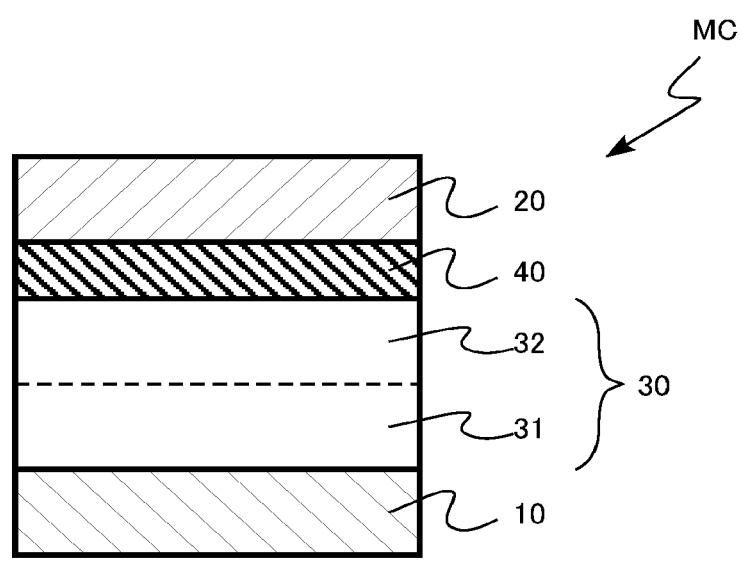
FIG. 6 is a schematic cross-sectional view of a memory cell of a storage device according to a second embodiment.

FIG. 6 is a schematic cross-sectional view of a memory cell of the storage device according to the second embodiment. FIG. 6 illustrates a cross section of one of the memory cells MC, for example, illustrated by dotted circles in the memory cell array 100 of FIG. 1.

As illustrated in FIG. 6, the memory cell MC includes a lower electrode 10 (first conductive layer), an upper electrode 20 (second conductive layer), a resistance change element 30, and a switching element 40 (intermediate layer).

The resistance change element 30 includes a high-resistance layer 31 and a low-resistance layer 32.

The high-resistance layer 31 is, for example, a metal oxide. The high-resistance layer 31 is, for example, an aluminum oxide, a hafnium oxide, a zirconium oxide, a tantalum oxide, a niobium oxide, or a compound of these materials.

The low-resistance layer 32 is, for example, a metal oxide. The low-resistance layer 32 is, for example, a titanium oxide, a niobium oxide, a tantalum oxide, or a tungsten oxide.

By applying a current to the resistance change element 30, the resistance change element 30 is changed from the high-resistance state to the low-resistance state or from the low-resistance state to the high-resistance state. Due to the application of the current to the resistance change element 30, oxygen ions move between the high-resistance layer 31 and the low-resistance layer 32, and thus, oxygen deficiency (oxygen vacancy) in the low-resistance layer 32 is changed. The conductivity of the resistance change element 30 is changed according to the oxygen deficiency in the low-resistance layer 32. The low-resistance layer 32 is a so-called vacancy modulated conductive oxide.

For example, the high-resistance state is defined as data "1", and the low-resistance state is defined as data "0". The memory cell is capable of storing 1-bit data of "0" and "1".

The configuration of the switching element 40 (intermediate layer) is the same as that of the storage device according to the first embodiment.

As described above, according to the storage device of the second embodiment, similarly to the first embodiment, it is possible to lower the threshold voltage while suppressing the increasing of the half-selection current of the switching element 40. Therefore, it is possible to suppress the half-selection leak current of the memory cell. Thus, for example, a storage device capable of perform a low-voltage operation is realized.

While certain embodiments have been described, these embodiments have been presented by way of example only, and are not intended to limit the scope of the inventions. Indeed, storage devices described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A storage device comprising:
a first conductive layer;
a second conductive layer;
a resistance change element provided between the first conductive layer and the second conductive layer; and
an intermediate layer provided in any one of a position between the resistance change element and the first conductive layer and a position between the resistance change element and the second conductive layer, the intermediate layer containing at least one element of silicon (Si) and germanium (Ge), tellurium (Te), and aluminum (Al),
wherein an atomic concentration of the at least one element in the intermediate layer is higher than an atomic concentration of aluminum (Al) in the intermediate layer.

2. The storage device according to claim 1, wherein the intermediate layer contains nitrogen (N).

3. The storage device according to claim 2, wherein an atomic concentration of nitrogen (N) in the intermediate layer is 30 atomic % or more.

4. The storage device according to claim 1, wherein the intermediate layer contains oxygen (O).

5. The storage device according to claim 1, wherein a sum of atomic concentrations of the at least one element, tellurium (Te), and aluminum (Al) in the intermediate layer is 50 atomic % or more.

6. The storage device according to claim 1, wherein the resistance change element includes a magnetic tunnel junction.

7. The storage device according to claim 1, wherein the at least one element is silicon (Si).

8. A storage device comprising:
a plurality of first wires;
a plurality of second wires intersecting the plurality of first wires; and
memory cells provided, in regions where the first wires and the second wires intersect each other,
wherein one of the memory cells includes a resistance change element provided between one of the first wires and one of the second wires and an intermediate layer provided in any one of a position between the resistance change element and the one of the first wires and a position between the resistance change element and the one of the second wire, the intermediate layer containing at least one element of silicon (Si) and germanium (Ge), tellurium (Te), and aluminum (Al), and
an atomic concentration of the at least one element in the intermediate layer is higher than an atomic concentration of aluminum (Al) in the intermediate layer.

9. The storage device according to claim 8, wherein the intermediate layer contains nitrogen (N).

10. The storage device according to claim 9, wherein an atomic concentration of nitrogen (N) in the intermediate layer is 30 atomic % or more.

11. The storage device according to claim 8, wherein the intermediate layer contains oxygen (O).

12. The storage device according to claim 8, wherein a sum of atomic concentrations of the at least one element, tellurium (Te), and aluminum (Al) in the intermediate layer is 50 atomic % or more.

13. The storage device according to claim 8, wherein the resistance change element includes a magnetic tunnel junction.

14. The storage device according to claim 8, wherein the at least element is silicon (Si).

15. A storage device comprising:
a plurality of first wires;
a plurality of second wires intersecting the plurality of first wires; and
memory cells provided in regions where the first wires and the second wires intersect each other,
wherein one of the memory cells includes a resistance change element and a switching element, the switching element provided in any one of a position between the resistance change element and the one of the first wires and a position between the resistance change element and the one of the second wires, the switching element containing at least one element of silicon (Si) and germanium (Ge), tellurium (Te), and aluminum (Al), and
an atomic concentration of the at least one element in the switching element is higher than an atomic concentration of aluminum (Al) in the switching element.

* * * * *